United States Patent [19]

Chan

[11] Patent Number: 5,381,453
[45] Date of Patent: Jan. 10, 1995

[54] EFFICIENT FUNCTIONAL TEST SCHEME INCORPORATED IN A PROGRAMMABLE DURATION BINARY COUNTER

[75] Inventor: Stephen H. Chan, Sunnyvale, Calif.

[73] Assignee: Zilog, Inc., Campbell, Calif.

[21] Appl. No.: 193,713

[22] Filed: Feb. 9, 1994

[51] Int. Cl.[6] .............................. H03K 21/40
[52] U.S. Cl. ............................ 377/28; 377/29
[58] Field of Search .......................... 377/28–29

[56] References Cited

FOREIGN PATENT DOCUMENTS

| 3801220 | 7/1989 | Germany | 377/29 |
| 0092673 | 4/1989 | Japan | 377/29 |

*Primary Examiner*—Margaret Rose Wambach
*Attorney, Agent, or Firm*—Majestic, Parsons, Siebert & Hsue

[57] ABSTRACT

A new technique for testing the counting functionality, loading functionality, and operational speed of a binary counter is provided wherein additional logic is incorporated into the counter to enable the counter to be functionally tested with a minimum number of clock cycles. Thus, for an n-bit counter which is partitionable into k subcounters, the counting functionality and operational speed of the counter may be tested in at most $2^{n/k}+2$ clock cycles, and the loading functionality of the counter may be tested in at most $2^{n/k}+1$ clock cycles.

32 Claims, 10 Drawing Sheets

EFFICIENT FUNCTIONAL TEST SCHEME INCORPORATED IN A PROGRAMMABLE DURATION BINARY COUNTER

BACKGROUND OF THE INVENTION

This invention relates in general to digital counters and more specifically to an efficient functional test scheme incorporated into a programmable duration binary counter.

Digital counters are used in a variety of applications ranging from data communication to digital processing systems. Basically, a digital counter receives at its input an enable signal. Each time this signal is received along with a clock signal, the counter increments or decrements its output by one. As a result, such counting devices can have a plurality of values, depending upon the number of bits that the counter is capable of storing.

It is often necessary to test counters for proper operation. Counters and other components are generally tested before shipment to a customer, but also can be tested by the customer upon delivery of the electronic equipment. Testing of counting devices is especially important to insure proper carry operation during incrementing. That is, when a binary 1 is added to a binary 1 already stored in a given bit location, the next significant bit must be incremented as a result of the carry thereto. Also, it is important to determine whether every bit of a counter can toggle properly. If a bit is stuck at zero, for example, then obviously operation of the entire counter is suspect.

In a number of applications, such as when the clock signal has a high frequency, the counter's ability to increment at high speeds becomes very important. Therefore, in addition to testing the counting functionality of the counter, it is also important to test the counter to insure that the counter is capable of operating properly at its maximum specified operating frequency.

Lastly, many of today's counters are able to be loaded with a predetermined value before commencement of the counting operation. In such counters, it is important to also test the loading functionality of the counter to ensure that each bit of the counter may be loaded with either a 1 or a zero.

Traditionally, every value of which a counter is capable of storing is tested individually and sequentially. This has been a time consuming process. For example, if a counter has 16 bits, the testing operation must be performed for each of the $2^{16}$ combinations to ensure that all values have been properly tested and that all bits have been evaluated for toggling as a consequence of the natural carry process. In addition, where the counter to be tested is loadable, each bit within the counter must be tested to ensure that it is capable of loading both a 1 and a zero. For a 16-bit counter, this testing of the loading functionality would typically require an additional $2^{16}+2$ clock cycles in the case where the values loaded into the counter can only be verified by having the counter count down/up until the counter is empty/full.

It should be appreciated that often many relatively large counters are present in an integrated circuit chip and that a great number of integrated circuit chips are used in larger systems. Thus, the amount of time spent testing systems is directly dependent on, inter alia, the time it takes to test a counter thoroughly. Similarly, during the counter manufacturing process, it is common to test a significant number or all of the manufactured counters in order to ensure that each counter is working properly before shipping.

One objective of the present invention, therefore, is to provide a testing process for a counter that works efficiently and quickly. Another objective is to provide a testing system for a counter that requires a minimum of additional logic circuitry. Yet another objective is to provide a counter tester that would operate in less time than conventional testers which require sequential accessing of every value in the counter. A final objective of the present invention is to provide a system that requires minimal programming of test bits to test the counter completely.

SUMMARY OF THE INVENTION

These and additional objects are accomplished by the various aspects of the present invention, wherein, briefly, a new technique for testing the counting functionality, loading functionality, and operational speed of a binary counter is provided wherein additional logic is incorporated into the counter to enable the counter to be functionally tested with a minimum number of clock cycles.

According to a first aspect of the present invention, an n-bit digital counter is disclosed which is partitionable into a plurality of k subcounters. The counter includes a loadable $(n+1)$th bit which functionally adds a higher significant bit to the counter for testing a longest delay path for a signal to propagate through said counter. The counter further includes logic means for testing the complete counting functionality and operational speed of the counter in at most $2^{n/k}+2$ clock cycles.

According to a second aspect of the present invention, an n-bit digital counter is disclosed which is partitionable into a plurality of k subcounters. The counter includes means for testing the loading functionality of each bit in the counter in at most $2^{n/k}+1$ clock cycles.

A third aspect of the present invention is directed to a system including an n-bit digital counter and circuitry for testing same, the system comprising a plurality of k subcounters; means for loading a predetermined binary number into each of the subcounters; means for testing a longest delay path for a signal to propagate through the counter which results in an inhibited change of state in the most significant bit, and for testing a longest delay path for a signal to propagate through the counter which results in an enabled change of state in the most significant bit of the counter; means for testing complete counting functionality and operational speed of the counter in at most $2^{n/k}+2$ clock cycles; and means for testing loading functionality of each bit in the counter in at most $2^{n/k}+1$ clock cycles.

A fourth aspect of the present invention is directed to a method for testing the complete counting functionality and operational speed of an n-bit digital counter which has been partitioned into a plurality of k subcounters and includes a loadable $(n+1)$th bit which functionally adds a higher significant bit to the counter. The method comprises the steps of loading a predetermined binary number into each of the plurality of subcounters and into the $(n+1)$th bit for purposes of testing the counting functionality and operational speed of the counter; and testing the complete counting functionality and operational speed of the counter in at most $2^{n/k}+2$ consecutive and continuous clock cycles, without a timed intervention during the counting functionality testing step. This aspect of the present invention enables the loading functionality and operational speed of the counter to be completely tested without interruption, starting from the moment an initial value is loaded into the counter, and ending when the counter has reached its terminal count.

A fifth aspect of the present invention is directed to a method for testing the complete loading functionality of an n-bit digital counter which has been partitioned into a plurality of k subcounters. The method for testing the loading functionality of the counter can be accomplished in at most $2^{n/k}+1$ clock cycles. The method comprises the steps of loading a first predetermined binary number into each of the plurality of subcounters; allowing each of the subcounters to simultaneously and independently count down without a timed intervention; verifying that each of the subcounters has reached its terminal count only upon the passage of a first predetermined number of consecutive and continuous clock cycles; loading a second predetermined binary number into each of the plurality of subcounters; allowing each of the subcounters to simultaneously and independently count down without a timed intervention; and verifying that each of the subcounters has reached its terminal count only upon the passage of a second predetermined number of consecutive and continuous clock cycles. The length of time it takes to complete this test is equal to the value of the first predetermined number of clock cycles plus the second predetermined number of clock cycles, which together total at most $2^{n/k}+1$ clock cycles.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

The present invention relates to a test scheme incorporated in a programmable duration binary counter logic that enables such logic to be functionally tested with a minimal number of clock cycles, thereby reducing test time. In the context of this discussion, functional testing is part of the screening process performed in either the production or operation environment to qualify passing or failing a device being tested.

Figure 1A:
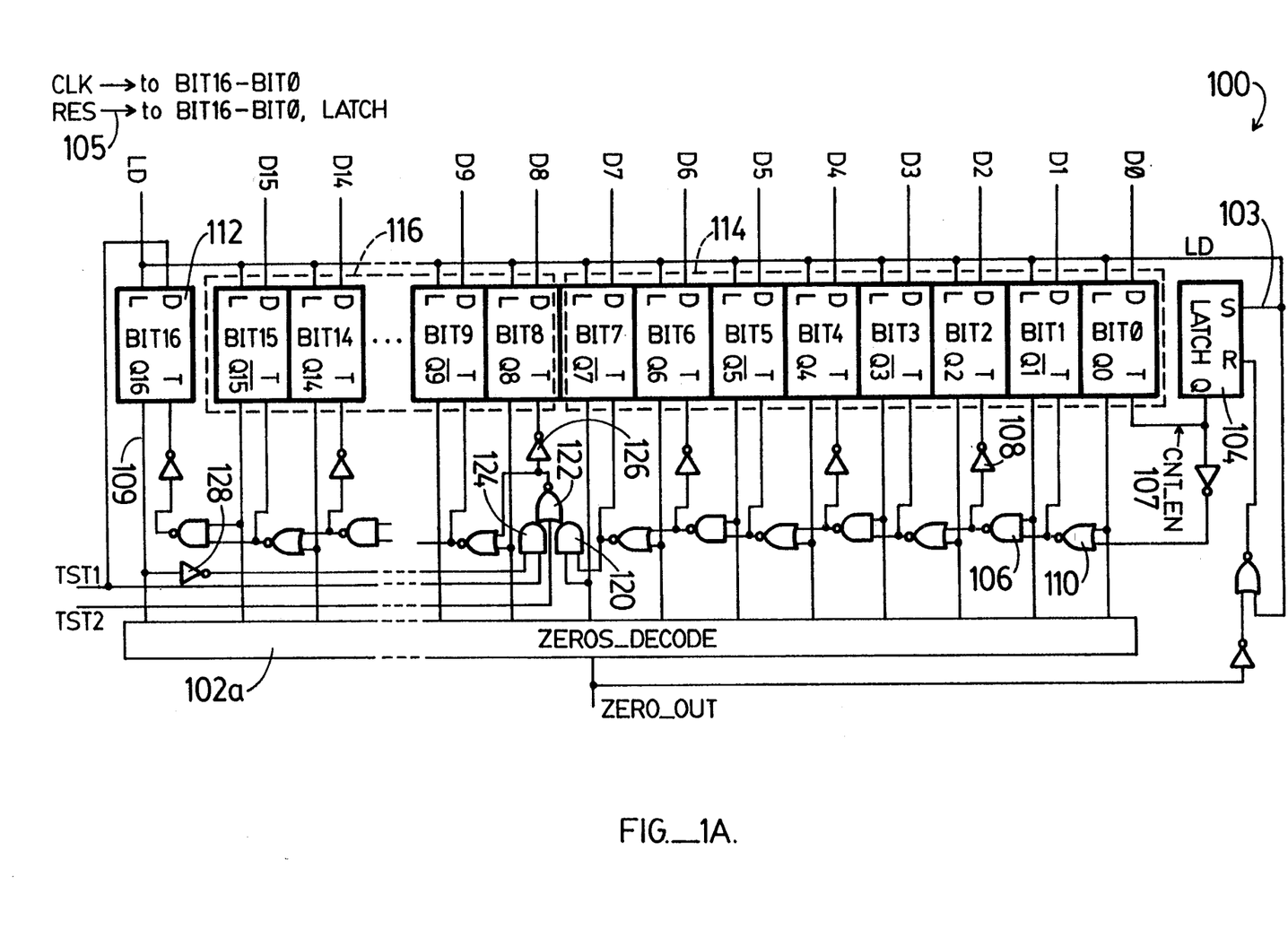
FIG. 1A is an illustration of a 16-bit binary down counter with built-in test circuitry in accordance with the present invention.
Figure 1B:
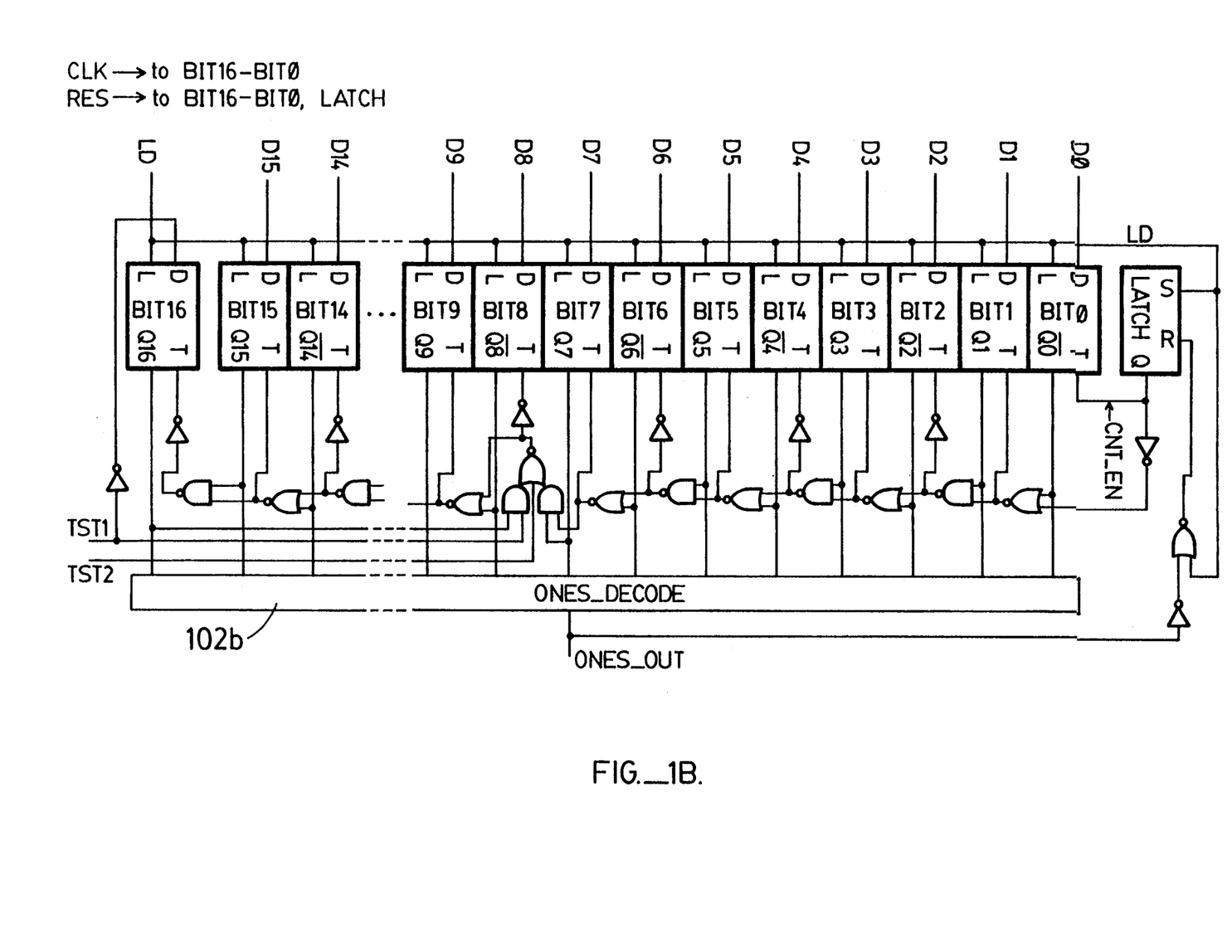
FIG. 1B is an illustration of a 16-bit binary up counter with built-in test circuitry in accordance with the present invention.

The first embodiment of the invention is depicted in FIG. 1A as counter 100. The embodiment of FIG. 1A depicts a 16-bit binary down counter with functional testing logic in accordance with the present invention. FIG. 1B depicts a 16-bit binary up counter with functional testing logic in accordance with the present invention. The technique of the present invention is equally applicable to both the up and down counter embodiments. For purposes of simplification, however, the embodiment of the 16-bit binary down counter will be described in detail, with the understanding that one skilled in the art, by extrapolation, would be able to apply the techniques of the present invention using the binary up counter as illustrated in FIG. 1B.

The 16-bit binary down counter of FIG. 1A is shown to comprise sixteen loadable toggle flip-flops labeled BIT15-BIT0 (from most to least significant bits). Each of BIT15-BIT0 includes a corresponding input line (D15-D0), which allows each bit to be loaded with a predetermined value. When the loading signal (LD) is at active logic 1, inputs D15 through D0 are loaded into BIT15 through BIT0, respectively. The binary value so loaded determines the down count duration, since the counter is decremented in each clock cycle until a zero value is reached.

Loading and toggling of the flip-flops are synchronous with respect to a common input clock (CLK). The ripple type down count control chain of the counter is implemented with combinational gates. As can be seen in FIGS. 1A and 1B, the specific inputs and implementation of these combinational gates may vary, depending on whether the counter is intended to be an up counter or down counter.

Counter 100 of FIG. 1A also comprises a ZEROS_DECODE logic block 102a, which has a plurality of inputs and an output labeled ZERO_OUT. The output of ZEROS_DECODE block 102a is at logic 1 only when the value of each bit of the counter is zero. In FIG. 1B, the ZEROS_DECODE logic block is replaced by a 1's decode logic block 102b having an output labeled ONES_OUT. The ONES_OUT will be at an active logic 1 only when the value of each bit of the counter is at logic 1.

Counter 100 of FIG. 1A also comprises an asynchronous SR latch 104 with an output Q signal 107 (CNT_EN). The CNT_EN signal goes to inactive logic zero when ZERO_OUT is active, which, in turn, places the counter in a quiescent state. The CNT_EN signal goes to active logic 1 in response to an active pulse at signal LD 103. Thus, when inactive, counter 100 will remain in a quiescent state until the loading of a desired count value into the counter. Once the desired count value has been loaded into counter 100, the down counting process will begin. This process will continue until each of BIT16–BIT0 simultaneously is at a value of zero.

Counter 100 also comprises an asynchronous reset input 105 (RES) that clears BIT15–BIT0 and the SR latch 104. Counter 100 also includes circuitry relating to the functional testing of the counter. This circuitry is described immediately below.

A loadable toggle flip-flop 112 (BIT16) is added to the counter and configured to functionally add a higher significant bit to the 16-bit counter. Note that BIT16 is also asynchronously cleared by reset signal 105.

The toggle control of BIT16 is implemented through combinational gates as shown in FIG. 1A. The output 109 of BIT16 (Q16) is fed to the input of ZEROS_DECODE logic block 102a. Thus, for ZEROS_DECODE logic block 102a to have its output ZERO_OUT go high, each of the bits (BIT15–BIT0 and BIT16) must be at logic zero.

The functional test circuitry within counter 100 also includes combinational gates 120, 122, and 124 in the down count control chain between BIT7 and BIT8. These gates serve to partition the 16-bit counter into two concurrently down counting 8-bit subcounters 114 and 116 during the functional testing of the counter (test modes 1 and 2). The different test modes of the counter are invoked by inputs TST1 and TST2, respectively, which are described in greater detail below.

It should be noted that although counter 100 is shown to be partitionable into two concurrently down counting subcounters 114 and 116, additional combinational gates may be included in the circuit of FIG. 1A to partition the counter into k concurrently down counting subcounters. One skilled in the art, in light of this disclosure, would be able to modify the circuit of FIG. 1A to incorporate such changes. The same is also true for FIG. 1B.

NORMAL OPERATION MODE OF THE BINARY COUNTER

During normal operation, counter 100 in FIG. 1A functions as an ordinary 16-bit binary down counter. For normal operation, inputs TST1 and TST2 are conditioned at inactive logic zeros. An example of the timing relationships between the various signals of counter 100 during normal operation is shown in FIG. 2.

Figure 2:
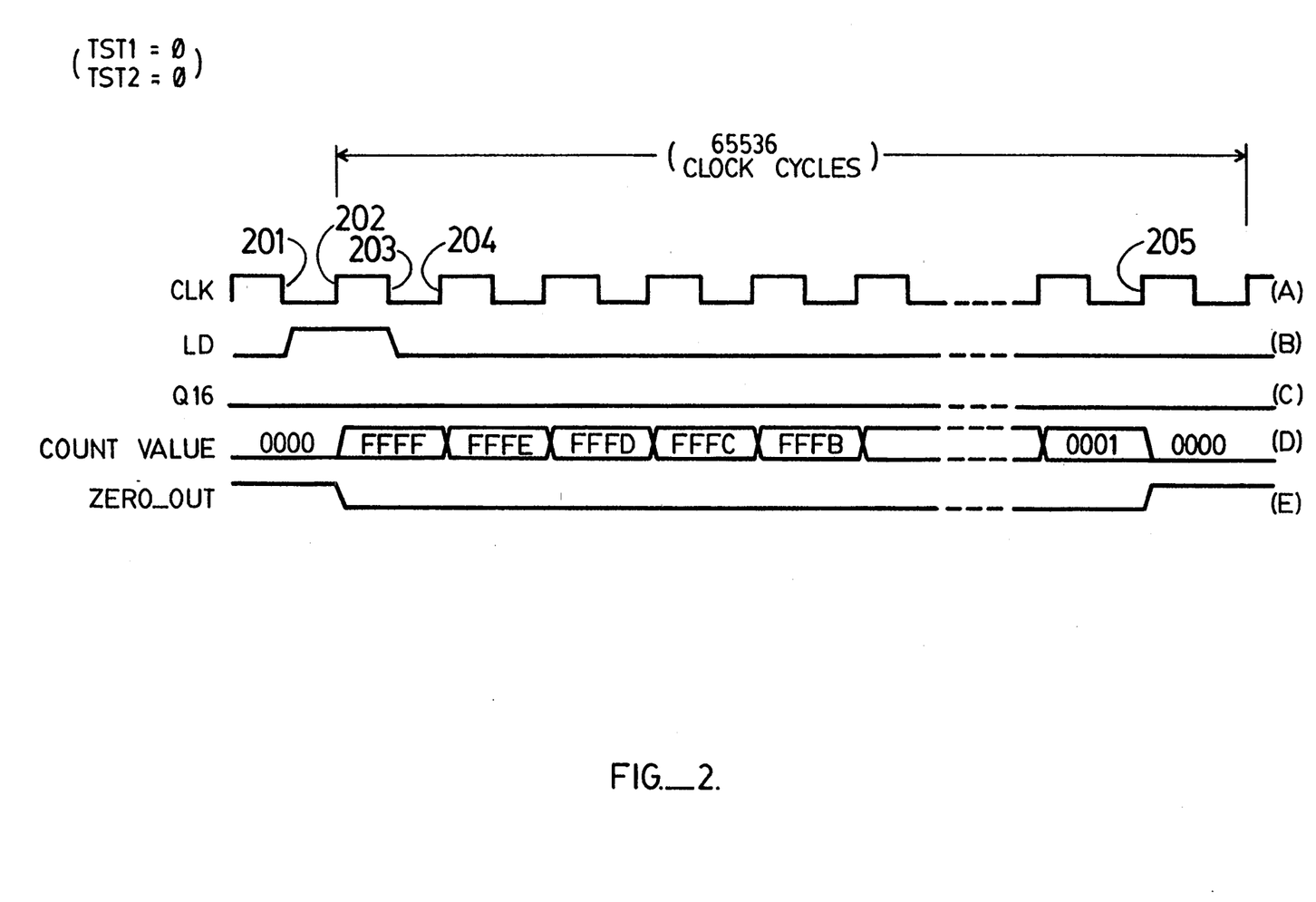
FIG. 2 is a timing illustration of the binary down counter of FIG. 1A during normal operation.

FIG. 2 illustrates the timing relationships of a 16-bit binary down counter during normal operation as the counter is loaded with all 1's (FFFF hexadecimal) and allowed to count down to all zeros. This is the maximum duration down count case. The relationship between the timing signals shown in FIG. 2 will now be briefly described.

At 201 the load signal LD goes from low to high, allowing each of the bits (BIT16–BIT0) to be loaded with a predetermined value which is supplied at its D input. Note that during normal mode, signals TST1 and TST2 are at logic zero, which means that BIT16 will be loaded with a zero, while BIT15–BIT0 are each loaded with their respective input D15–D0. In the example of FIG. 2, BIT15–BIT0 are each loaded with a 1. This is indicated in FIG. 2 at 202, wherein the count value of the 16-bit counter goes from the value 0000 to the value FFFF hexadecimal. At 203 the load signal LD goes from 1 to 0, whereupon the counter begins to count down at 204 starting from the value FFFF. Note also that the ZERO_OUT signal from ZEROS_DECODE block 102a (FIG. 1A) goes from a 1 to a 0 as soon as the count value of the counter goes from 0000 to FFFF. The ZERO_OUT signal will remain at zero so long as the count value of the counter is anything but zero. At 205 the count value of the counter goes from 0001 to 0000, at which time the ZERO_OUT signal from ZEROS_DECODE logic block 102a goes from a zero to a 1, indicating that the counter has reached its terminal count.

The example of FIG. 2 illustrates the timing for the maximum duration down count case, wherein all 1's are loaded into each of the bits (BIT15–BIT0) of the counter. The number of clock cycles required to reach a zero count value is 65536.

Figure 3:
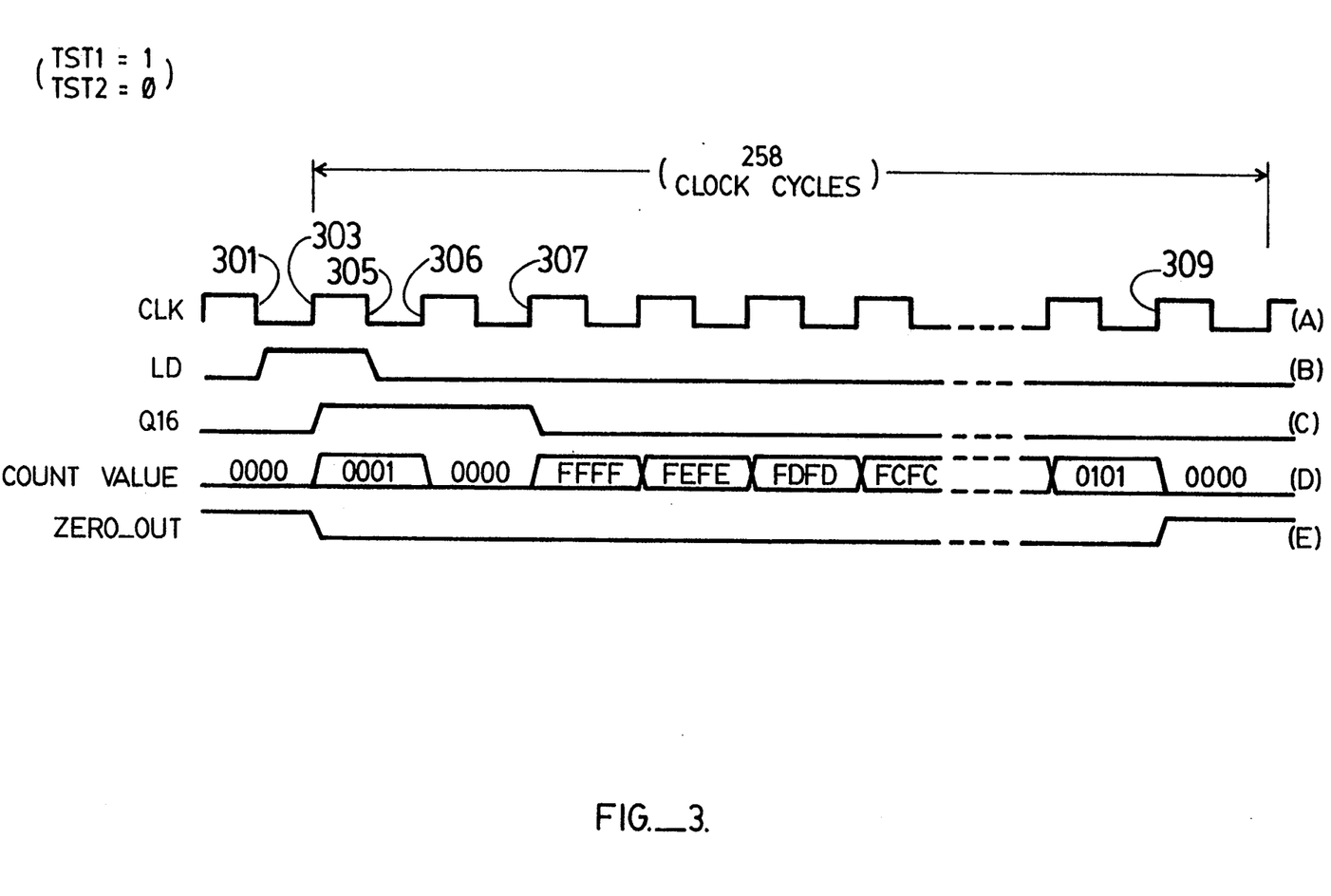
FIG. 3 is a timing illustration of the binary down counter of FIG. 1A during test mode 1, wherein the counting functionality and operational speed of the counter of FIG. 1A are tested.

TESTING THE COUNTING FUNCTIONALITY AND OPERATIONAL SPEED OF THE COUNTER:

FIG. 3 is a timing illustration of the binary down counter of FIG. 1A during test mode 1, wherein the counting functionality and operational speed of the counter of FIG. 1A are tested. Test mode 1 is entered by conditioning TST1 at active logic 1, while conditioning TST2 at inactive logic zero. During this testing sequence, the signal LD is at logic 1 at 301–305, causing a value of 0001 hexadecimal to be loaded into the 16-bit counter, and activating the count down process. Note that the input to BIT16 is tied directly to the TST1 line, meaning that BIT16 will be loaded with a logic 1 while the rest of the counter will be loaded with 0001 hexadecimal, resulting in an effective 17-bit binary number 100–001 as the starting value. After the load signal LD changes from logic 1 to logic 0 at 305, the down counting process commences at 306.

At this point, a first aspect of the counter to be tested is the longest delay path for a signal to propagate through the entire counter which results in an inhibited change of state in the most significant counting bit (BIT15). This occurs when the least significant bit (BIT0) changes from a 1 to a zero. Assuming that the counter is functioning properly, the new count value should be a 1 followed by a string of sixteen zeros (i.e. 1000–000).

Note that the inclusion of a (n+1)th bit (BIT16) adds a built-in safety factor to the testing procedure to ensure that the counter is capable of operating at its highest designated frequency. This results from the fact that the testing of the highest operating frequency includes the propagation delay from the nth bit (BIT15) to the (n+1)th bit (BIT16). This added propagation delay, however, will not be realized during normal operation of the counter since, during normal operation, the most significant bit of the counter (i.e. the MSB counting bit) is designated to be the nth bit.

Upon the next decrement count, the counter is then tested for a longest delay path for a signal to propagate through the entire counter which results in an enabled change of state in the most significant counting bit (BIT15). This occurs when the count value changes from 1000–0000 to 0111–1111. These two tests, together, functionally test the operational speed of the counter by verifying that the counter is functioning properly at a maximum specified operational speed, which is determined by the clock (CLK) frequency. Thus, if the counter is able to function at the specified operational speed as determined by the clock frequency, the count value should go from 1000–0001 to 1000–0000 at 306, and from 1000–0000 to 0111–1111 at 307.

At the point where the count value during test mode 1 reaches FFFF (i.e. 0111–1111), BIT15–BIT8 and BIT7–BIT0 behave as two separate 8-bit subcounters 116 and 114, each containing all 1's. This occurs at 307 in FIG. 3. The means for dividing counter 100 into a plurality of subcounters 116 and 114 is shown in FIG. 1A. Basically, counter 100 is configured such that when BIT16 is at logic zero (during either test modes 1 or 2), BIT8 is forced to toggle at each clock cycle, thereby causing BIT15-BIT8 to function as a one subcounter, while BIT7-BIT0 function as another subcounter. One skilled in the art would readily understand how the counter of FIG. 1A is divided into a plurality of subcounters, and therefore, a more detailed discussion of this aspect of the circuit of FIG. 1A will not be provided.

At 307, the count value during test mode 1 reaches FFFF, and counter 100 is partitioned into two separate subcounters 116 and 114, wherein each of the subcounters simultaneously and concurrently counts down the value of their respective subcounter until the ZERO__OUT signal goes to a logic 1.

Including the loading of the initial value into the counter, the counting process should preferably continue for 258 consecutive and continuous clock cycles, whereupon the ZERO_OUT signal from the ZEROS_DECODE logic block 102a should go to an active 1 at 309, indicating that the COUNT VALUE of the counter is zero. If the ZERO_OUT signal goes to a logic 1 either before or after the 258 clock cycle, the counter has failed the counting functionality and operational speed test.

The total number of clock cycles required to test the counting functionality of the 16-bit down counter (BIT-0-BIT15) is 256. Since two additional clock cycles are needed to test the operational speed of the counter, the total number of clock cycles required for testing the complete counting functionality and operational speed of the counter is 258.

One advantageous feature of the present invention is that the testing of both the counting functionality and operational speed of the counter may be performed as a single process, without the need for a timed intervention, and without the need to load additional values into the counter. In other words, once counter 100 has been placed into test mode 1, the counting functionality and operational speed of the counter may both be tested by loading a single predetermined value into the counter and allowing the counter to count down without intervention until a counter value of zero is reached. If the zero value occurs on the 258th clock cycle, and not before or after, then the counter has passed both the counting functionality and operational speed tests.

It should be noted that while the counter of FIG. 1A is depicted as being partitionable into two subcounters 114 and 116, additional logic may be added to the counter of FIG. 1A to enable the counter to be partitioned into a plurality of k subcounters. Such a configuration would be apparent to one skilled in the art in light of the circuitry shown in FIG. 1A. Furthermore, the present invention is not limited only to 16-bit binary counters, but may include any n-bit binary counter constructed in a manner similar to that of FIG. 1A. One skilled in the art, by extrapolation, would be able to construct such an n-bit counter which is partitionable into a plurality of k subcounters in light of the diagrams provided in FIG. 1A. The same is also true for FIG. 1B.

For such an n-bit counter partitionable into a plurality of k subcounters and built in accordance with the present invention, the testing of the complete counting functionality and operational speed of the counter may be accomplished in at most $2^{n/k}+2$ consecutive and continuous clock cycles. Thus, in the example shown in FIG. 1A, n=16 and k=2, meaning that the counting functionality and operational speed of the counter of FIG. 1A may be tested in at most $2^{16/2}+2=258$ clock cycles. If the 16-bit counter were partitioned into four 4-bit subcounters, the counting process would take 18 clock cycles. If partitioned into eight 2-bit counters, the counting process would take 6 clock cycles.

Note that some delay is introduced to the count down control chain in each partition boundary where slightly more complex gating is included, as shown in FIG. 1A by elements 120, 122, 124. This, in turn, reduces the maximum possible operating frequency, and should preferably be considered when designing counters for particular applications.

It should also be noted that the operational features and advantages of the counter of FIG. 1A are also incorporated into the counter of FIG. 1B. Moreover, the basic operational discussion of the counter of FIG. 1A is similar to that of FIG. 1B, with the exception that the initial binary value loaded into the counter of FIG. 1B should preferably be complementary to the binary value loaded into FIG. 1A. Thus, for example, the starting value for testing the counting functionality and operational speed of the counter of FIG. 1B (i.e. test mode 1) should preferably be 0111-1110 rather than 1000-0001.

Assuming that counter 100 passes the counting functionality and operational speed testing, the loading functionality of the counter is then tested.

TESTING THE LOADING FUNCTIONALITY OF THE BINARY COUNTER

Figure 4:
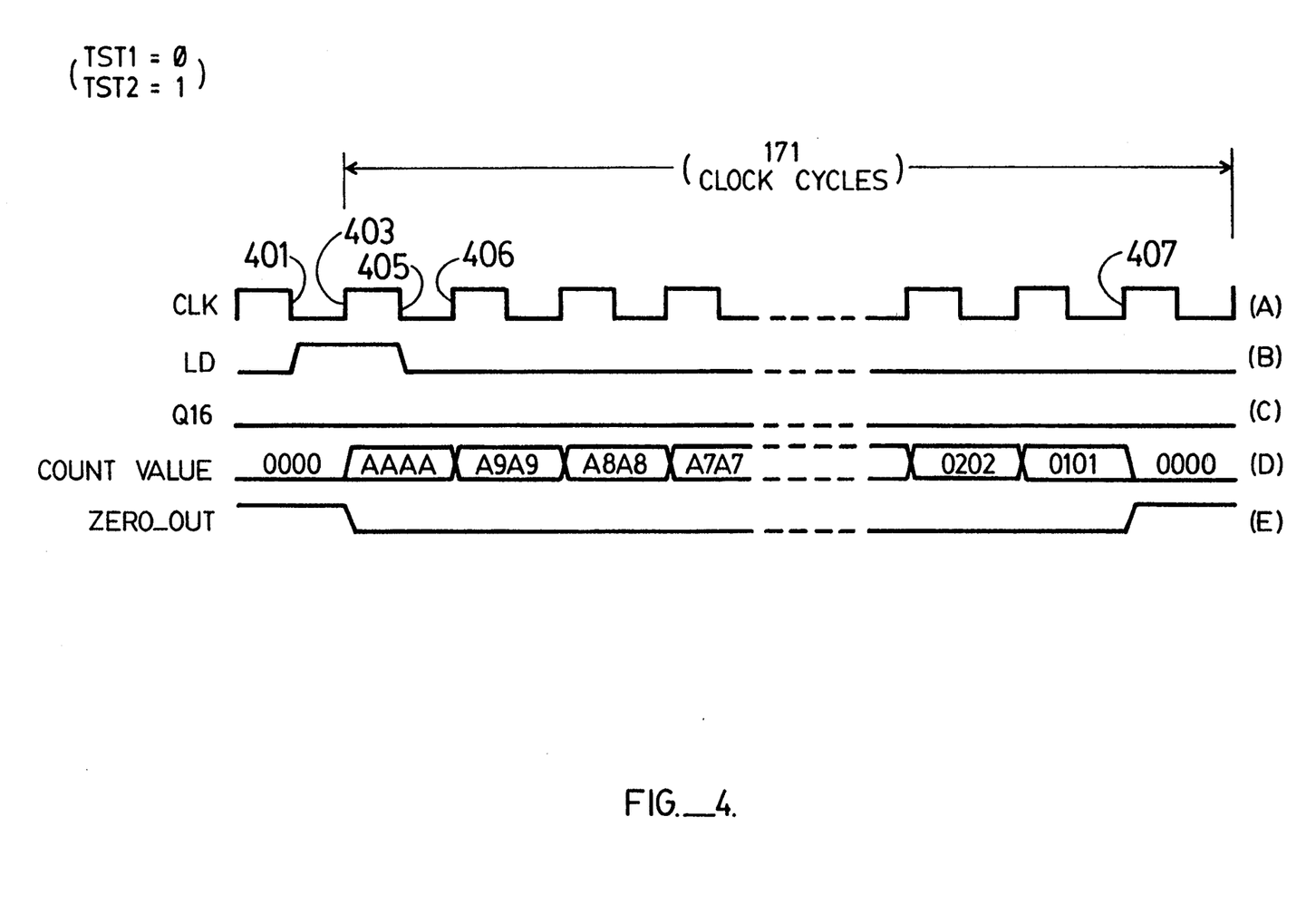
FIG. 4 is a timing illustration of the various signals within the binary down counter of FIG. 1A during test mode 2, wherein a first part of the loading functionality of the bits within the counter are tested.
Figure 5:
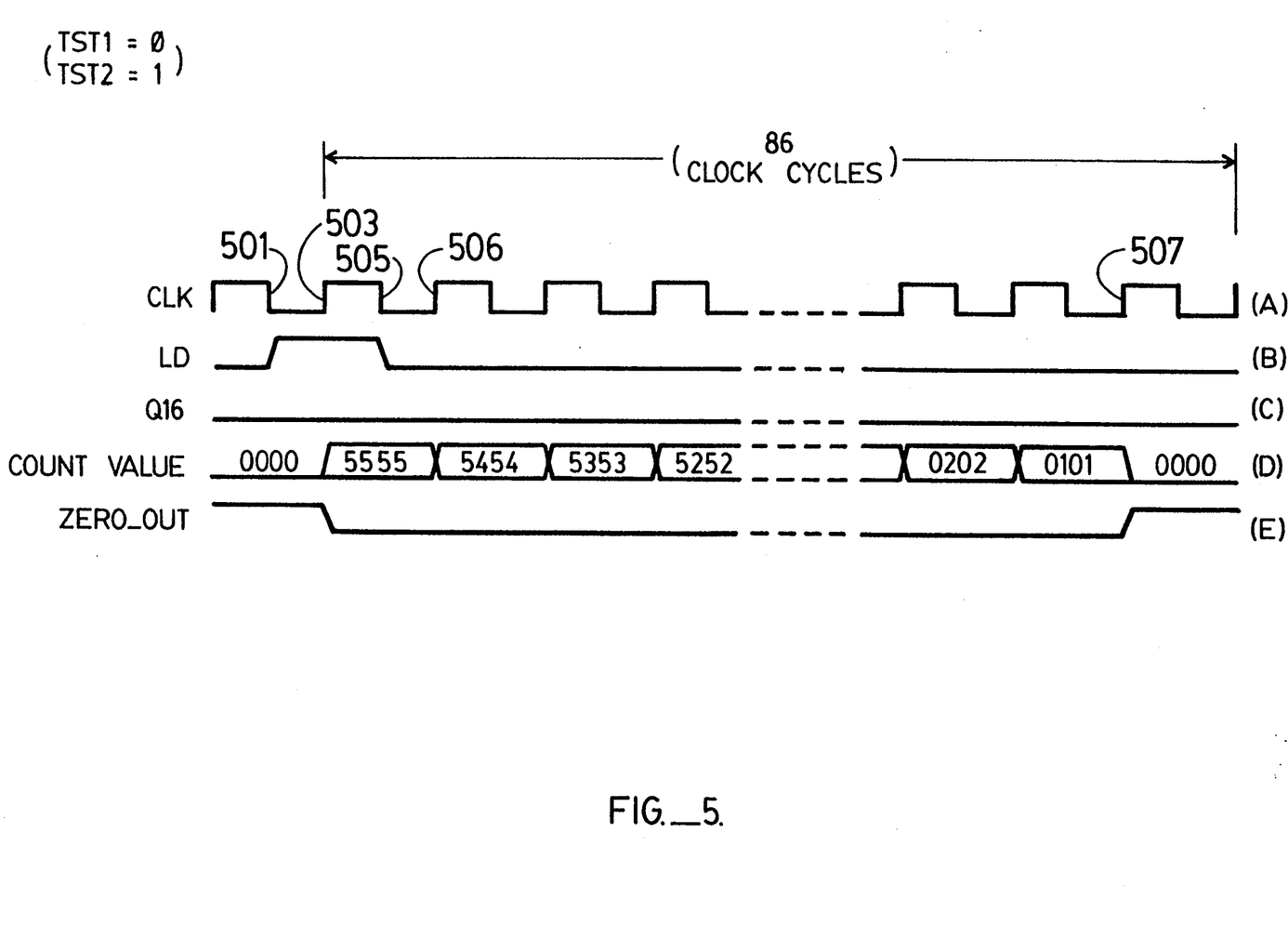
FIG. 5 is a timing illustration of the various signals of the binary down counter of FIG. 1A during test mode 2, wherein a second part of the loading functionality of bits within the counter are tested.

FIGS. 4 and 5 illustrate timing diagrams of the various signals within the binary down counter of FIG. 1A during test mode 2, wherein the loading functionality of each of BIT15-BIT0 is tested for logic 0 and logic 1 being loaded. FIGS. 4 and 5 show example values to be loaded, and the associated timing to reach zero count.

Test mode 2 is entered by conditioning TST2 at active logic 1, while conditioning TST1 at logic zero. Referring first to FIG. 4, a first part of the loading functionality test of each bit of the counter is performed by loading the value AAAA hexadecimal (1010-1010 binary) into counter 100. Note that while this value is being loaded into BIT15-BIT0 of the counter, BIT16 is loaded with a zero since the TST1 signal is zero during test mode 2.

The loading of the value AAAA into BIT15-BIT0 will require 171 consecutive and continuous clock cycles to count down. Therefore, if each of the respective 1's and 0's of BIT15-BIT0 has been loaded correctly, the ZERO_OUT signal should go from 0 to 1 only upon the passing of 171 clock cycles, as measured from the time that the down count value is loaded. If the ZERO_OUT signal goes to 1 before or after the 171st clock cycle, the loading functionality test of the counter has failed.

Note that during the count down process of test mode 2, the counter is again partitioned into two separate subcounters 116 and 114, each simultaneously and concurrently counting down their respective values until a zero value is reached in each subcounter.

Assuming that counter 100 passes the first part of the loading functionality test described above with respect to FIG. 4, the complementary loading functionality of each of BIT15-BIT0 is then tested for logic 0 and logic 1 being loaded. This means that where a logic 1 was loaded into a particular bit during the first part of the test as shown in FIG. 4, a zero is now loaded in that same bit during the second part of the test as shown in FIG. 5. Similarly, where a 0 was loaded during the first part of the test, a 1 will be loaded into that bit during the second part of the test.

Referring to FIG. 5, it can be seen that BIT15-BIT0 are loaded with a value whose binary representation is complementary to the binary representation of the value loaded into the counter during the first part of the test. Thus, in the examples of FIG. 4 and FIG. 5, the first part of the test loaded a value of 1010-1010 into BIT15-BIT0. The complementary value is therefore 0101-0101 (5555 hexadecimal). Thus, as shown in FIG. 5, 5555 hexadecimal is loaded into the counter at 503. The counter is then allowed to count down without interruption, wherein each of the subcounters 114 and 116 counts down simultaneously and independently, causing the COUNT VALUE to change as indicated in FIG. 5.

Upon the 86th clock cycle, the ZERO_OUT signal should go to active 1. If the ZERO_OUT signal goes to active 1 either before or after the 86th clock cycle, the counter has failed the loading functionality test.

It should be noted that the loading values used in FIGS. 4 and 5 are for illustrative purposes. Other values may be used, and are considered within the scope of this invention, so long as the binary representation of the value loaded during the first part of test mode 2 is complementary to the binary representation of the value loaded during the second part of test mode 2. Moreover, the length of time to completely test the loading functionality of the binary counter of the present invention will depend upon the number of bits (n) in the binary counter and upon the number of subcounters (k) into which the counter has been partitioned. Using the technique of the present invention, the number of clock cycles needed to completely test the loading functionality of an n-bit counter partitioned into a plurality of k subcounters and configured in accordance with the present invention is $2^{n/k}+1$.

ADVANTAGES:

The functional test scheme disclosed in the present application is endowed with the characteristics and advantages listed below.

First, the present invention is able to test a longest delay path for a signal to propagate through an n-bit counter which results in an inhibited change of state in the nth bit, and is able to test a longest delay path for a signal to propagate through the n-bit counter which results in an enabled change of state in the nth bit. The combination of two test, therefore, tests the highest operating frequency of the counter. In addition, the inclusion of a (n+1)th bit adds a built-in safety factor to the testing procedure to ensure that the counter is capable of operating at its highest designated frequency. This results from the fact that the testing of the highest operating frequency includes the propagation delay from the nth bit to the (n+1)th bit. This added propagation delay, however, will not be realized during normal operation of the counter since, during normal operation, the most significant bit of the counter is designated to be the nth bit.

Second, all control chain nodes of the present invention are able to be tested at correct logic 0's and 1's. This includes the testing of control chain nodes at partition boundaries.

Third, present invention tests all counter bits for correct toggling to logic 0's and 1's. In addition, the present invention tests all counter bits for correct loading of logic 0's and 1's.

Fourth, the present invention is able to test the complete functionality, including counting functionality, loading functionality, and operational speed of the counter in a minimum number of clock cycles which, for an n-bit counter partitioned into k subcounters is $2 \times 2^{n/k}+3$. Moreover, each of the advantages described above have been incorporated into the present invention using a minimal amount of test logic, thereby minimizing the cost and complexity of the counter.

MODIFICATIONS OF THE PRESENT INVENTION:

The functional test scheme and binary counter of the present invention can also be adapted and/or modified for other binary counter designs. Where such modifications are contemplated, an additional clock cycle may be needed during test mode 1 in order to functionally test the modifications. Additional clock cycles may also be needed if the modification includes the feature of loading a particular count value from a count value register into the counter before each counting cycle. Examples of various modifications to the present invention are discussed below.

Figure 6:
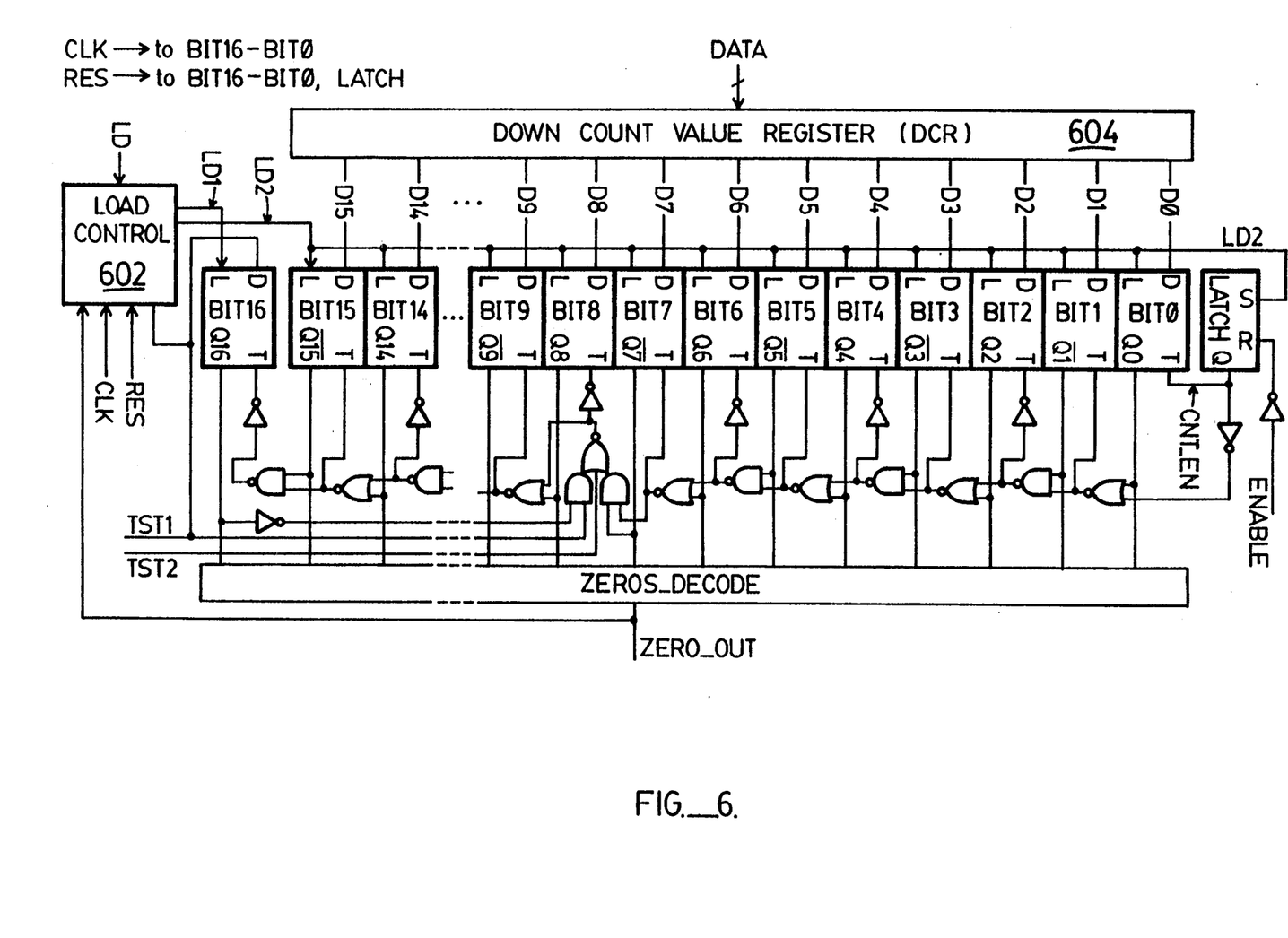
FIG. 6 is an illustration of an alternate embodiment of the present invention including automatic reloading of the counter at terminal count.

The present invention may be modified to incorporate a binary up or down counter which can be automatically re-loaded with a predetermined value at the end of each counting cycle. An example of such a modification is shown in FIG. 6. As shown in FIG. 6, a load control block 602 is included which detects and responds to the counter reaching its terminal count. In normal mode and in test mode 2, an active LD signal or active ZERO_OUT signal will cause the LD2 output to go to active 1, while LD1 remains at inactive 0, thereby causing the counter to be re-loaded with the value stored in the down count value register 604. In test mode 1, an active LD signal or active ZERO_OUT signal will cause both the LD1 and LD2 outputs to go to active 1.

Figure 7:
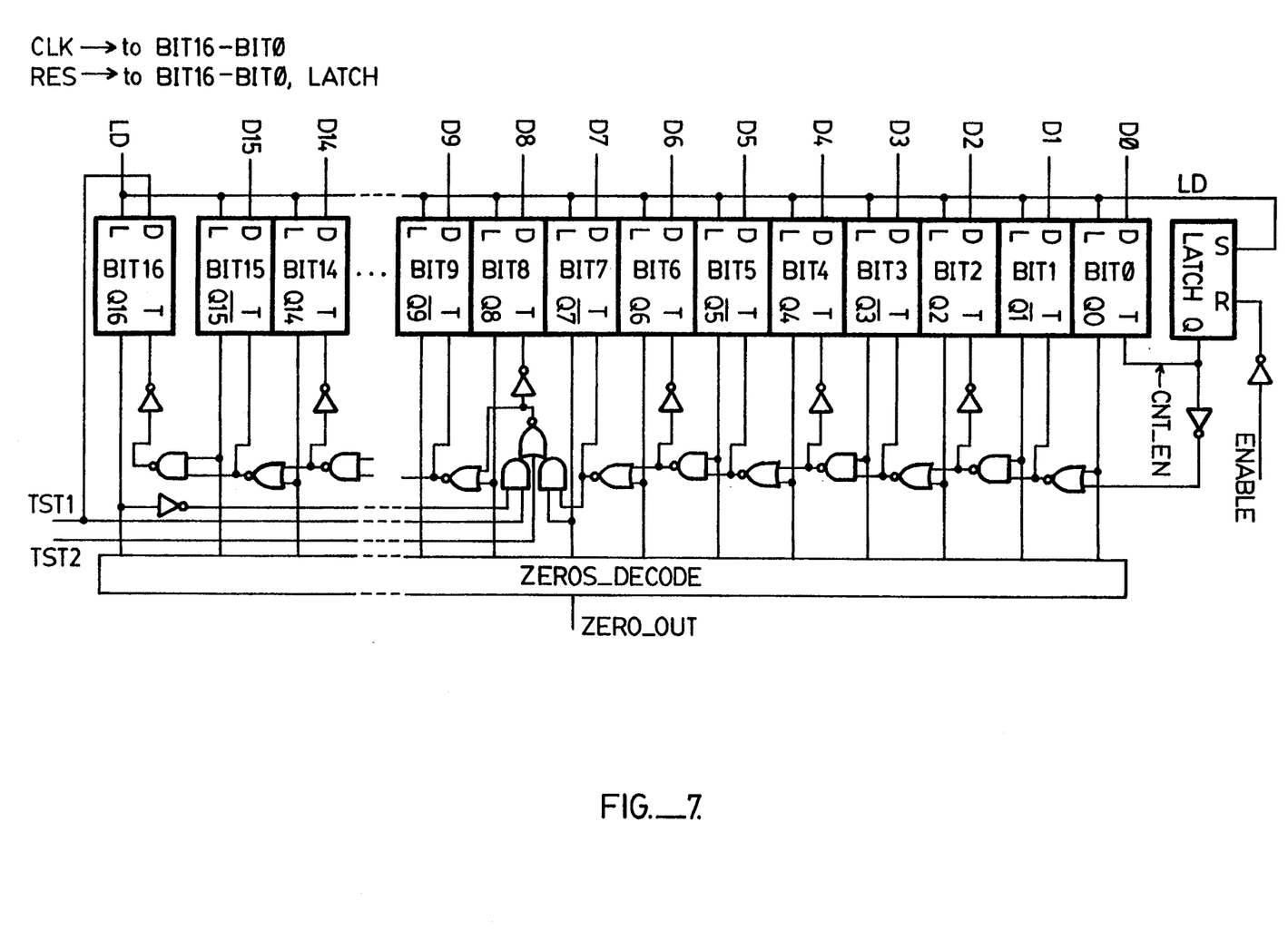
FIG. 7 is an illustration of an alternate embodiment of the present invention including automatic wrap-around of the count value at terminal count.

The present invention may also be modified to incorporate a binary up or down counter with automatic-wrap-around at terminal count that functions to generate a pulse train with an offset of a first value. An example of such a modification is shown in FIG. 7. As shown in FIG. 7, the counter of the present invention has been modified so as to allow the counter to continue counting even after the counter has reached its terminal count. Thus, in accordance with this modified embodiment, once the value of the counter reaches 0000 hex, the next clock cycle will decrement the counter, causing the count value to become FFFF hex. The counter will continue to count down again to 0000 hex, whereupon the cycle will then be repeated.

The present invention may also be modified to incorporate a counter with carry look-ahead control logic. Such look-ahead logic is discussed in Pat. No. 5,185,769 to Wang which is hereby incorporated by reference in its entirety. In such a modification, it is preferable to have the partition boundaries of the counter aligned with the look-ahead boundaries.

Figure 8:
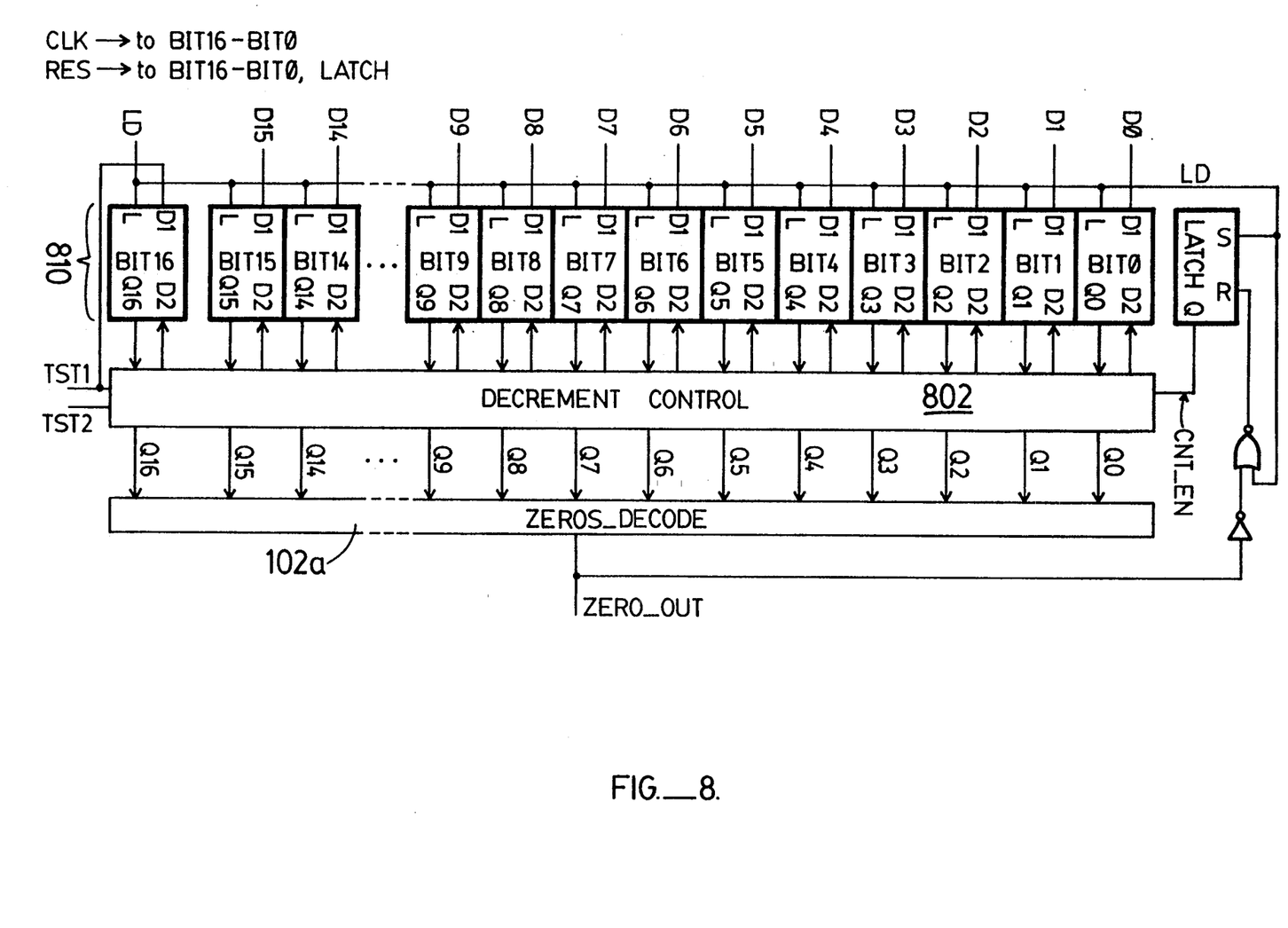
FIG. 8 is an illustration of an alternate embodiment of the present invention wherein the counter is implemented with D-type flip-flops.

The present invention may also be modified to incorporate an up or down counter implemented with a plurality of sample and hold (D-type) flip-flops 810. An example of such a modification is shown in FIG. 8. As shown in FIG. 8, lines Q16-Q0 are inputs to both the decrement control block 802 and the zeros_decode block 102a. The decrement control block 802 controls the D2 input values to BIT16–BIT0.

Figure 9:
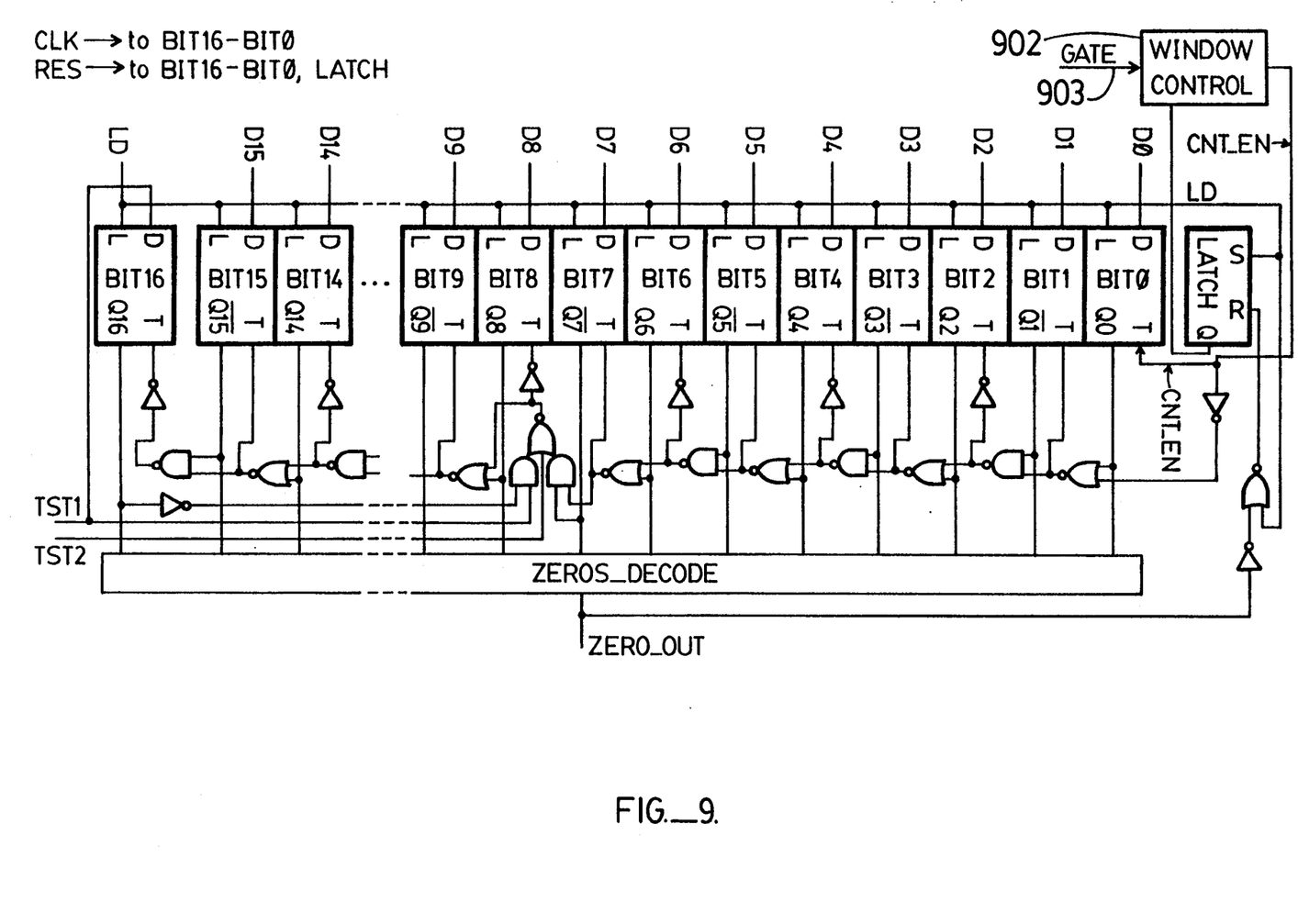
FIG. 9 is an alternate embodiment of the present invention including window control for controlling when the counter is on/off.

The present invention may also be modified to incorporate an up or down counter with gating control (i.e. on/off count windows), wherein the counter is enabled only during specified time windows. An example of such a modification is shown in FIG. 9. As shown in FIG. 9, window control block 902 is responsive to a gating signal (GATE) 903 for controlling the status of the CNT_EN signal. The CNT_EN signal, in turn, controls the on/off state of the counter (i.e. whether the counter is active or inactive).

The present invention may also be modified to incorporate a re-triggerable up or down counter, wherein the counter can be re-loaded before reaching its terminal count.

Although several preferred embodiments of this invention have been described in detail herein with reference to the accompanying drawings, it is to be understood that the invention is not limited to these precise embodiments, and that various changes and modifications (such as, for example, those described above) may be effected therein by one skilled in the art without departing from the scope or spirit of the invention as defined in the appended claims.

It is claimed:

1. An n-bit digital down counter including a least significant bit and a most significant (nth) bit, said counter comprising:
   a plurality of k subcounters, each of said subcounters including means for loading a predetermined binary number therein;
   a loadable (n+1)th bit which functionally adds a higher significant bit to the counter for testing a longest delay path for a signal to propagate through said counter which results in an inhibited change of state in said nth bit, and for testing a longest delay path for a signal to propagate through said counter which results in an enabled change of state in said nth bit;
   zeros decode logic for detecting a zero value in each of said subcounters and said (n+1)th bit; and
   means for testing complete counting functionality and operational speed of said counter in at most $2^{n/k}+2$ clock cycles.

2. An n-bit digital down counter including a least significant bit and a most significant (nth) bit, said counter comprising:
   a plurality of k subcounters, each of said subcounters including means for loading a predetermined binary number therein;
   a loadable (n+1)th bit which functionally adds a higher significant bit to the counter;
   zeros decode logic for detecting a zero value in each of said subcounters and said (n+1)th bit; and
   means for testing loading functionality of each bit in said counter in at most $2^{n/k}+1$ clock cycles.

3. The counter of claims 1 or 2 wherein said counter further comprises:
   a plurality of loadable toggle flip-flops; and
   a ripple type down count control chain implemented with combinational gates.

4. The counter of claims 1 or 2 wherein said counter further comprises an asynchronous SR latch having a count enable output connected to said counter for placing said counter in a quiescent state, and for starting a counting process of the counter.

5. The counter of claims 1 or 2 further comprising means for automatically re-loading the counter with a predetermined value after the counter has reached a value of zero.

6. The counter of claims 1 or 2 further comprising means for causing the counter to automatically begin counting down from a maximum counter value after the counter has reached a value of zero, thereby enabling the counter to function as a pulse train with an offset of a first value.

7. The counter of claims 1 or 2 further comprising a carry look-ahead circuit for facilitating high speed operation of the counter.

8. The counter of claims 1 or 2 further comprising a plurality of sample and hold flip-flops.

9. The counter of claims 1 or 2 further comprising gating control means responsive to a gating signal for controlling when the counter is active and for controlling when the counter is inactive.

10. The counter of claims 1 or 2 further comprising means for re-loading the counter with a predetermined value before the counter reaches a value of zero.

11. A system including an n-bit digital down counter and circuitry for testing same, said counter including a least significant bit and a most significant (nth) bit, said system comprising:
   a plurality of k subcounters;
   means for loading a predetermined binary number into each of said subcounters;
   zeros decode logic for detecting a zero value in each of said subcounters; and
   means for testing a longest delay path for a signal to propagate through said counter which results in an inhibited change of state in said nth bit, and for testing a longest delay path for a signal to propagate through said counter which results in an enabled change of state in said nth bit;
   means for testing complete counting functionality and operational speed of said counter in at most $2^{n/k}+2$ clock cycles; and
   means for testing loading functionality of each bit in said counter in at most $2^{n/k}+1$ clock cycles.

12. A method for testing complete counting functionality and operational speed of an n-bit digital down counter having a least significant bit and a most significant (nth) bit, said counter including a loadable (n+1)th bit which functionally adds a higher significant bit to the counter, said counter being divided into a plurality of k subcounters, said method comprising the steps of:
   (a) loading a predetermined binary number into each of said plurality of subcounters and into said (n+1)th bit for purposes of testing the counting functionality and operational speed of said counter;
   (b) testing the complete counting functionality and operational speed of said counter in at most $2^{n/k+2}$ clock cycles without a timed intervention during said counting functionality testing step.

13. The method of claim 12 wherein said counting functionality testing step (b) comprises the steps of:
   allowing each of said subcounters to simultaneously and independently count down without a timed intervention until a predetermined number of consecutive and continuous clock signals has elapsed; and
   verifying that each of said subcounters and said (n+1)th bit has a value of zero only upon the passage of said predetermined number of consecutive and continuous clock cycles.

14. The method of claim 12 wherein said counting functionality testing step (b) comprises the steps of:
  testing a longest delay path for a signal to propagate through said counter which results in an inhibited change of state in said nth bit; and
  testing a longest delay path for a signal to propagate through said counter which results in an enabled change of state in said nth bit.

15. The method of claim 12 wherein said counting functionality testing step (b) comprises the step of simultaneously and independently testing the counting functionality of each of said plurality of subcounters to thereby test the complete counting functionality and operational speed of said counter in at most $2^{n/k}+2$ clock cycles.

16. A method for testing complete loading functionality of an n-bit digital down counter in a minimal number of clock cycles, said counter having a least significant bit and a most significant (nth) bit, said counter being divided into a plurality of k subcounters, wherein said minimal number of clock cycles is at most $2^{n/k}+1$ clock cycles, said method comprising the steps of:
  (a) loading a first predetermined binary number into each of said plurality of subcounters for purposes of testing a first loading functionality of a plurality of bits within each subcounter;
  (b) allowing each of said subcounters to simultaneously and independently count down without a timed intervention, said count down beginning from said first predetermined number and continuing without a timed intervention until a first predetermined number of clock signals has elapsed;
  (c) verifying that each of said subcounters has a value of zero only upon the passage of said first predetermined number of consecutive and continuous clock cycles;
  (d) loading a second predetermined binary number into each of said plurality of subcounters for purposes of testing a complementary loading functionality of said plurality of bits within each subcounter, said second predetermined number being complementary to said first predetermined number;
  (e) allowing each of said subcounters to simultaneously and independently count down without a timed intervention, said complementary count down beginning from said complementary predetermined number and continuing without a timed intervention until a second predetermined number of clock signals has elapsed; and
  (f) verifying that each of said subcounters has a value of zero only upon the passage of said second predetermined number of consecutive and continuous clock cycles;
  wherein said first predetermined number of clock cycles and said second predetermined number of clock cycles together total at most $2^{n/k}+1$ clock cycles.

17. An n-bit digital up counter including a least significant bit and a most significant (nth) bit, said counter comprising:
  a plurality of k subcounters, each of said subcounters including means for loading a predetermined binary number therein;
  a loadable (n+1)th bit which functionally adds a higher significant bit to the counter for testing a longest delay path for a signal to propagate through said counter which results in an inhibited change of state in said nth bit, and for testing a longest delay path for a signal to propagate through said counter which results in an enabled change of state in said nth bit;
  ones decode logic for detecting when each of said subcounters and said (n+1)th bit is at their respective counting capacity; and
  means for testing complete counting functionality and operational speed of said counter in at most $2^{n/k}+2$ clock cycles.

18. An n-bit digital up counter including a least significant bit and a most significant (nth) bit, said counter comprising:
  a plurality of k subcounters, each of said subcounters including means for loading a predetermined binary number therein;
  a loadable (n+1)th bit which functionally adds a higher significant bit to the counter;
  ones decode logic for detecting when each of said subcounters and said (n+1)th bit is at their respective counting capacity; and
  means for testing loading functionality of each bit in said counter in at most $2^{n/k}+1$ clock cycles.

19. The counter of claims 17 or 18 wherein said counter further comprises:
  a plurality of loadable toggle flip-flops; and
  a ripple type up count control chain implemented with combinational gates.

20. The counter of claims 17 or 18 wherein said counter further comprises an asynchronous SR latch having a count enable output connected to said counter for placing said counter in a quiescent state, and for starting a counting process of the counter.

21. The counter of claims 17 or 18 further comprising means for automatically re-loading the counter with a predetermined value after the counter has reached its counting capacity.

22. The counter of claims 17 or 18 further comprising means for causing the counter to automatically begin counting up from a value of zero after the counter has reached its maximum value, thereby enabling the counter to function as a pulse train with an offset of a first value.

23. The counter of claims 17 or 18 further comprising a carry look-ahead circuit for facilitating high speed operation of the counter.

24. The counter of claims 17 or 18 further comprising a plurality of sample and hold flip-flops.

25. The counter of claims 17 or 18 further comprising gating control means responsive to a gating signal for controlling when the counter is active and for controlling when the counter is inactive.

26. The counter of claims 17 or 18 further comprising means for re-loading the counter with a predetermined value before the counter reaches its counting capacity.

27. A system including an n-bit digital up counter and circuitry for testing same, said counter including a least significant bit and a most significant (nth) bit, said system comprising:
  a plurality of k subcounters;
  means for loading a predetermined binary number into each of said subcounters;
  ones decode logic for detecting when each of said subcounters is at their respective counting capacity; and
  means for testing a longest delay path for a signal to propagate through said counter which results in an inhibited change of state in said nth bit, and for testing a longest delay path for a signal to propagate through said counter which results in an enabled change of state in said nth bit;

means for testing complete counting functionality and operational speed of said counter in at most $2^{n/k}+2$ clock cycles; and means for testing loading functionality of each bit in said counter in at most $2^{n/k}+1$ clock cycles.

28. A method for testing complete counting functionality and operational speed of an n-bit digital up counter having a least significant bit and a most significant (nth) bit, said counter including a loadable (n+1)th bit which functionally adds a higher significant bit to the counter, said counter being divided into a plurality of k subcounters, said method comprising the steps of:

(a) loading a predetermined binary number into each of said plurality of subcounters and into said (n+1)th bit for purposes of testing the counting functionality and operational speed of said counter;

(b) testing the complete counting functionality and operational speed of said counter in at most $2^{n/k}+2$ clock cycles without a timed intervention during said counting functionality testing step.

29. The method of claim 28 wherein said counting functionality testing step (b) comprises the steps of:

allowing each of said subcounters to simultaneously and independently count up without a timed intervention until a predetermined number of consecutive and continuous clock signals has elapsed; and verifying that each of said subcounters and said (n+1)th bit is at its maximum value only upon the passage of said predetermined number of consecutive and continuous clock cycles.

30. The method of claim 28 wherein said counting functionality testing step (b) comprises the steps of:

testing a longest delay path for a signal to propagate through said counter which results in an inhibited change of state in said nth bit; and testing a longest delay path for a signal to propagate through said counter which results in an enabled change of state in said nth bit.

31. The method of claim 28 wherein said counting functionality testing step (b) comprises the step of simultaneously and independently testing the counting functionality of each of said plurality of subcounters to thereby test the complete counting functionality and operational speed of said counter in at most $2^{n/k}+2$ clock cycles.

32. A method for testing complete loading functionality of an n-bit digital up counter in a minimal number of clock cycles, said counter having a least significant bit and a most significant (nth) bit, said counter being divided into a plurality of k subcounters, wherein said minimal number of clock cycles is at most $2^{n/k}+1$ clock cycles, said method comprising the steps of:

(a) loading a first predetermined binary number into each of said plurality of subcounters for purposes of testing a first loading functionality of a plurality of bits within each subcounter;

(b) allowing each of said subcounters to simultaneously and independently count up without a timed intervention, said count up beginning from said first predetermined number and continuing without a timed intervention until a first predetermined number of clock signals has elapsed;

(c) verifying that each of said subcounters is at its maximum value only upon the passage of said first predetermined number of consecutive and continuous clock cycles;

(d) loading a second predetermined binary number into each of said plurality of subcounters for purposes of testing a complementary loading functionality of said plurality of bits within each subcounter, said second predetermined number being complementary to said first predetermined number;

(e) allowing each of said subcounters to simultaneously and independently count up without a timed intervention, said complementary count up beginning from said complementary predetermined number and continuing without a timed intervention until a second predetermined number of clock signals has elapsed; and (f) verifying that each of said subcounters is at its maximum value only upon the passage of said second predetermined number of consecutive and continuous clock cycles;

wherein said first predetermined number of clock cycles and said second predetermined number of clock cycles together total at most $2^{n/k}+1$ clock cycles.

* * * * *